United States Patent [19]
Viswanath et al.

[11] Patent Number: 6,072,322
[45] Date of Patent: Jun. 6, 2000

[54] THERMALLY ENHANCED TEST SOCKET

[75] Inventors: Ram S. Viswanath, Phoenix; Martin M. Maxwell, Chandler, both of Ariz.

[73] Assignee: Intel Corporation, Santa Clara, Calif.

[21] Appl. No.: 09/000,631

[22] Filed: Dec. 30, 1997

[51] Int. Cl.[7] .................................................. G01R 31/02
[52] U.S. Cl. .......................................... 324/754; 324/758
[58] Field of Search .................................. 324/754, 755, 324/758, 760, 761, 765, 72.5

[56] References Cited

U.S. PATENT DOCUMENTS

| | | | |
|---|---|---|---|
| 4,839,587 | 6/1989 | Flatley et al. | 324/761 |
| 4,887,147 | 12/1989 | Friedman | 174/252 |
| 5,196,785 | 3/1993 | Douglas | 324/754 |
| 5,402,077 | 3/1995 | Agahdel et al. | 324/758 |
| 5,608,267 | 3/1997 | Mahulikar et al. | 257/796 |
| 5,807,104 | 9/1998 | Ikeya et al. | 324/765 |
| 5,822,848 | 10/1998 | Chiang | 29/827 |
| 5,847,366 | 12/1998 | Grunfeld | 219/497 |
| 5,865,639 | 2/1999 | Fuchigami et al. | 439/330 |
| 5,891,759 | 4/1999 | Ostuki | 438/122 |
| 5,892,278 | 4/1999 | Horita et al. | 257/706 |
| 5,907,189 | 5/1999 | Metrol | 257/787 |

*Primary Examiner*—Josie Ballato
*Assistant Examiner*—T. R. Sundaram
*Attorney, Agent, or Firm*—Blakely, Sokoloff, Taylor & Zafman LLP

[57] ABSTRACT

A test socket having a heat slug for removing heat from an electronic device positioned within the socket. In one embodiment the test socket includes a burn-in board electrically coupled to a test unit that generates a series of test signals to test the performance of the electronic device. Examples of electronic devices that can be tested by the test socket are integrated circuit packages such as tape carrier packages (TCP), ball grid arrays (BGA), pin grid arrays (PGA), land grid arrays (LGA), and other packages. The integrated circuit package is positioned within the socket which electrically connects the package to a printed circuit board, such as a burn-in board. The test socket includes an opening in which a heat slug is disposed. The heat slug has a contact surface that contacts the integrated circuit device under test. In another embodiment, the socket includes a lid having a heat slug attached to the lid, which heat slug has a contact surface that contacts an integrated circuit device under test.

32 Claims, 6 Drawing Sheets

THERMALLY ENHANCED TEST SOCKET

FIELD OF THE INVENTION

The present invention relates generally to testing of integrated circuit devices and, more specifically, to a burn-in socket which is used for purposes of testing integrated circuit devices.

BACKGROUND OF THE INVENTION

Tape Automated Bonding (TAB) is a process that is used to interconnect a chip to a package. The TAB process involves bonding an integrated circuit (IC) device to a patterned metal on a polymer tape which typically consists of copper foil on a polyimide tape. Once the IC device is bonded to the tape the apparatus is commonly referred to as a Tape Carrier Package (TCP).

Figure 1A:
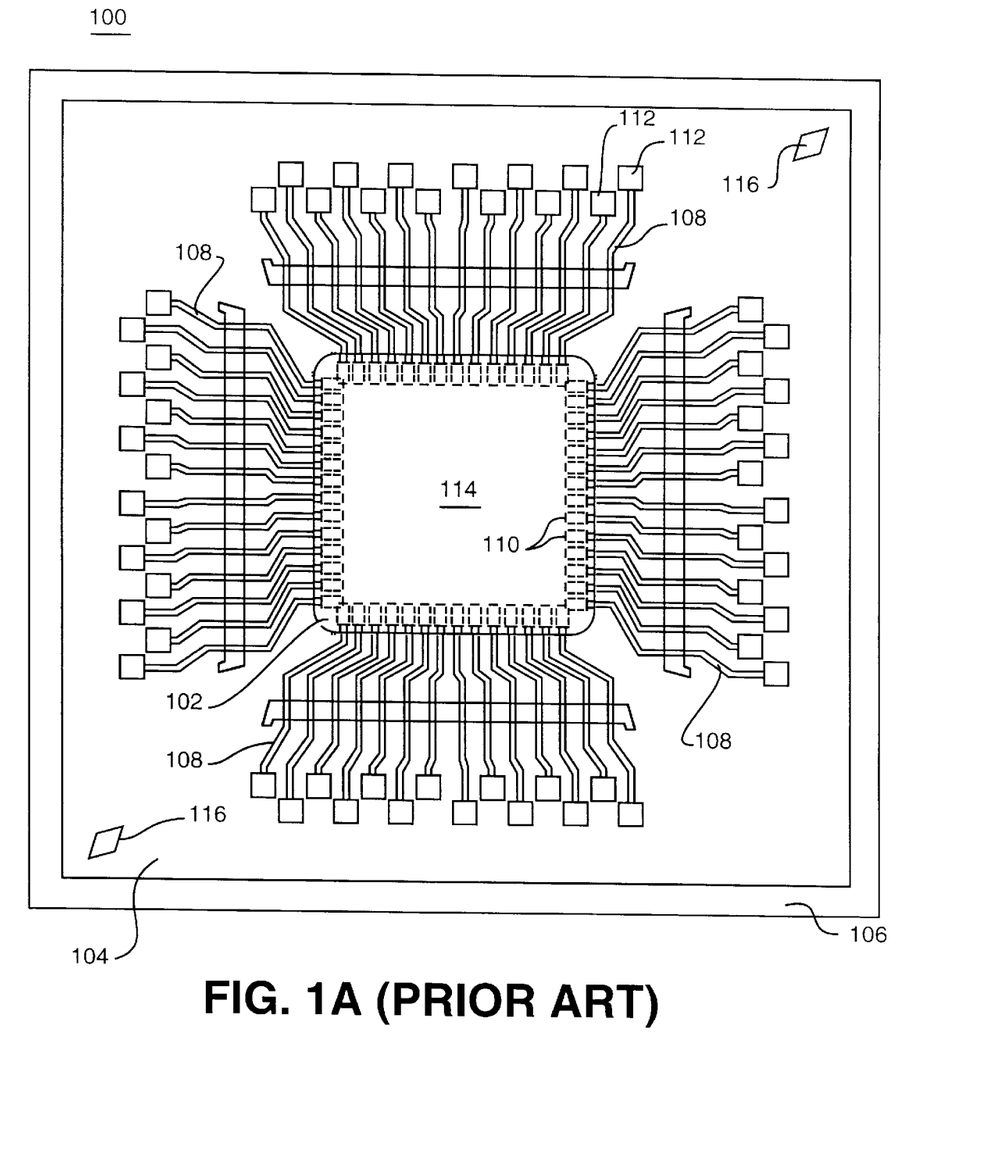
FIG. 1A illustrates a top view of a conventional Tape Carrier Package.
Figure 1B:
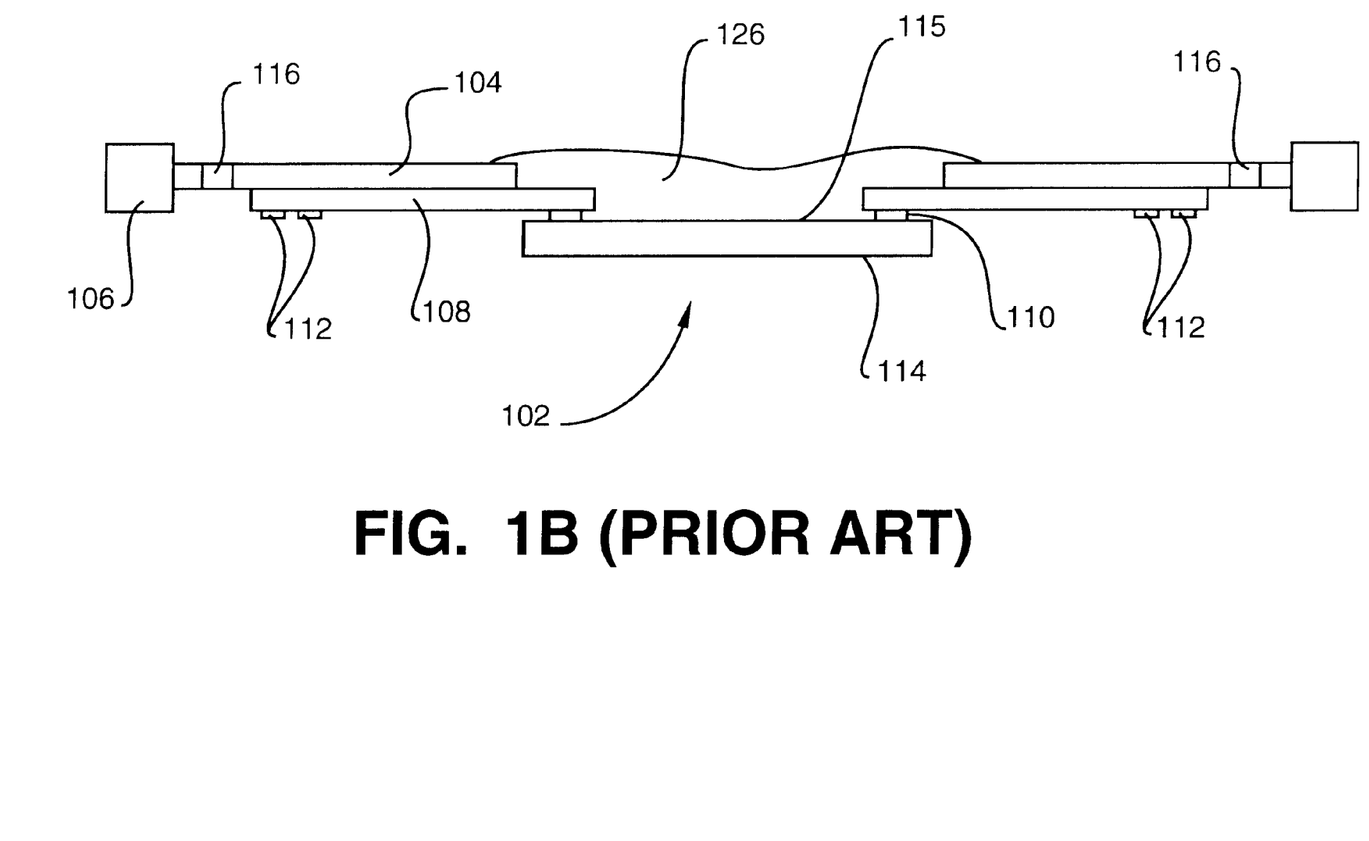
FIG. 1B illustrates a side view of the Tape Carrier Package shown in FIG. 1A.

FIGS. 1A and 1B illustrate a top and side view of a typical prior art TCP 100, respectively. As shown in FIGS. 1A and 1B, the frontside of an integrated circuit device 102 is attached to the polyimide tape 104. The tape 104 is secured within a plastic carrier 106 which provides structural support to the TCP. Bond pads 110 on the frontside of the integrated circuit device are bonded to copper leads 108 formed on the polyimide tape 104. The copper on the polyimide tape 104 is patterned to form the electrically conductive leads 108 which are used for power, ground, and signal distribution between IC device 102 and a substrate, such as a printed circuit board (PCB). Test pads 112 are provided along the outer periphery of TCP 100 to facilitate the electrical testing of IC device 102 before the TCP is shipped to the customer. A plastic encapsulant 126 covering the frontside surface 115 of device 102 provides protection to bond pads 110 and the frontside (active side) surface of the device. Alignment holes 116 in tape 104 facilitate the alignment of test pads 112 with the corresponding electrical interface structure of a test device (not shown).

During the post-manufacture of integrated circuit devices, the devices are subjected to a reliability test called "burn-in" prior to their shipment. The burn-in test is a functional test subjecting an integrated circuit device to a temperature and voltage condition for the purpose of screening out bad devices. The devices attain thermal equilibrium (steady state) when subject to this test. The present invention is aimed at steady state heat dissipation from the surface(s) of an integrated circuit device(s) during functional tests such as burn-in.

During burn-in, the integrated circuit device is housed in a semiconductor package such as a TCP, ball grid array (BGA), pin grid array (PGA), land grid array (LGA), and other packages. The semiconductor package is positioned within a socket that electrically connects the package to a printed circuit board. The printed circuit board is commonly referred to as a "burn-in board" (BIB). The burn-in board includes a multilayer printed circuit board that couples the socket to a test system.

It is important to control the temperature of the integrated circuit device since excessive temperatures may affect the performance of the circuit and cause permanent degradation of the device. In addition, it is desirable to hold the temperature of the integrated circuit device at a relatively constant temperature throughout the test.

The traditional method for cooling integrated devices during burn-in has been through convection heat transfer. Using this method, heat is dissipated from the integrated circuit through the outer surfaces of the device into still or moving air. As the integration level (i.e., the number of transistors per device) of integrated circuits increases, or the power requirements, or the operating speed of these integrated circuits increases, the amount of heat generated by these devices increases to a point where conventional convection solutions are inadequate. This poses a particular problem when testing integrated circuit devices housed within TCPs or other packages having a low thermal mass (i.e. LGAs). If the integrated circuit device is not adequately cooled during the test, and is permitted to rise significantly above a designated test temperature, the device may suffer permanent degradation. In such instances, the integrated circuit must be discarded.

Thus, what is needed is an apparatus for controlling the temperature of an integrated circuit device during burn-in.

SUMMARY OF THE INVENTION

The invention provides a test socket having a heat slug for removing heat from an integrated circuit device positioned within the socket.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus for removing heat from an integrated circuit device during burn-in is described. In the following description, numerous specific details are set forth in order to provide a thorough understanding of the invention. However, it will be obvious to one of skill in the art that the invention may be practiced without these specific details. In other instances, well known elements have not been shown in particular detail in order to avoid unnecessarily obscuring the present invention.

As previously discussed, many modern integrated circuit devices have evolved to a point where convection heat transfer alone is unable to provide adequate cooling to the devices during the performance and functionality test of such devices. In accordance with the present invention a burn-in socket having an integral heat slug is provided which facilitates the removal of heat from an integrated circuit device housed within a semiconductor package during burn-in.

Figure 2A:
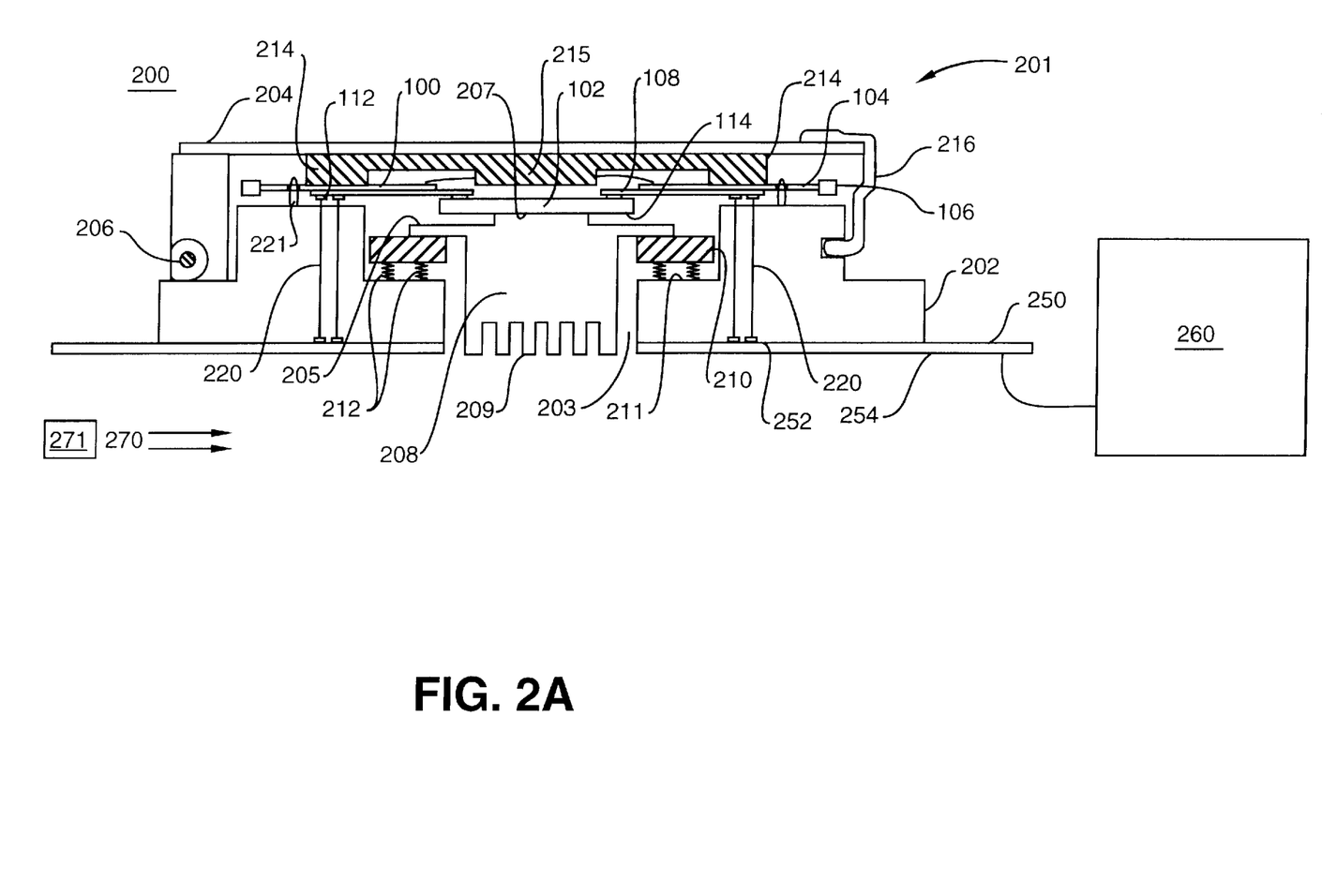
FIG. 2A is a side view of a burn-in socket for testing a TCP in one embodiment of the present invention.

FIG. 2A illustrates a test apparatus 200 for testing the TCP 100 shown in FIGS. 1A and 1B. As previously described, TCP 100 includes an integrated circuit device 102 whose frontside is mounted to a polyimide tape 104. Copper leads 108 electrically couple the integrated circuit device 102 to test pads 112 located at the periphery of the TCP. The polyimide tape 104 is secured within a plastic housing 106 that provides structural support to the TCP.

The test apparatus 200 includes a socket 201 that is electrically coupled to a burn-in board 250. Burn-in board 250 is, in turn, electrically coupled to a test unit 260 that is used to generate a series of test signals to test the performance of integrated circuit device 102 while the device is maintained at an elevated temperature. Burn-in board 250 generally includes a multiple layer printed circuit board.

Socket 201 includes a body 202 having a plurality of electrical connectors 220 disposed along a top surface thereof. In one embodiment, connectors 220 comprise double-ended pogo pins that extend through the socket body. The pogo pins extending out of the top surface of the socket body 202 are used for contacting the test pads 112 on TCP 100. The opposite end of the pogo pins extend from the bottom surface of body 202 and make contact with contact pads 252 on burn-in board 250. It is appreciated that electrical connectors 220 may include any type of connector that is capable of providing a temporary and repeatable electrical connection between socket 201 and TCP 100.

A heat slug 208 is provided in a through opening 203 of body 202. Heat slug 208 is made of a thermally conductive material and has a contact surface 207 for contacting the backside surface 114 of integrated circuit device 102. Heat slug 208 provides socket 201 with a thermal mass for absorbing heat that is generated by integrated circuit device 102 while the device is being tested and also acts as a heat sink to dissipate heat away from the integrated circuit device. In one embodiment, heat slug 208 has fins 209 that extend into an opening in burn-in board 250. Heat slug 208 is made of material having a high thermal conductivity and a high thermal capacitance. For example, in one embodiment, heat slug 208 comprises aluminum. In another embodiment, heat slug 208 is made of copper. The heat slug may contain an inert plating, such as nickel, along contact surface 207 for wear resistance. Heat slug 208 includes a flange section 205 that is attached to a top surface of a floating base 210 by a double sided tape or other type of adhesive. Base 210 is supported on a ledge 211 located within the opening 203 of body 202 by a set of springs 212. In lieu of using springs, bellows or other compliant materials/movable means may be used to support the floating base 210.

A lid 204 is attached to the socket body 202 by a hinge 206. The lid 204 is movable between an open position and a closed position. A releasable latch mechanism 216 is used to hold the lid in a closed position as illustrated in FIG. 2A. Formations 214 are provided on the inside surface of lid 204 for forcibly engaging the test pads 112 of TCP 100 into intimate contact with electrical connectors 220 when the lid is moved into a closed position. A second formation 215 is also provided on the inside surface of lid 204 for engaging the backside surface 114 of device 102 into thermal contact with the contact surface of heat slug 208. In one embodiment, formations 214 and 215 are made of a compliant material such as foam rubber.

In accordance with the present invention, testing of TCP 100 includes positioning the TCP within socket 201 so that the test pads 112 contact the electrical connectors 220 extending from the top surface of socket body 202 and such that the backside surface 114 of integrated circuit device 102 is in contact with heat slug 208. Alignment pins 221 are provided in the socket body 202 to receive the alignment holes 116 of TCP 100. Once the TCP 100 is properly aligned on the socket body 202, the lid 204 is moved from an open position to a closed position. As the lid 204 is closed, formations 214 are moved into contact with the TCP 100 causing test pads 112 to be forced against electrical connectors 220. Once the TCP 100 is secured within the socket 201, the socket 201 and burn-in board 250 combination is placed within a temperature controlled environmental chamber and a series of test signals are applied to the integrated circuit 102 by test unit 260. This results in the generation of heat which must be dissipated from the integrated circuit device 102 in order to conform to applicable test requirements and/or to maintain the temperature of the device within safe operating limits. By providing a heat slug within socket 201, excess heat generated by integrated circuit device 102 during testing is dissipated through the backside surface 114 of the device and into heat slug 208. An opening in burn-in board 250 exposes heat slug 208 to a fluid flow 270 that is provided along the backside surface of the burn-in board. Excess heat generated by integrated circuit device 102 is conducted away from the backside surface 114 of the device into heat slug 208 and dissipated by convection heat transfer into fluid flow 270. Fluid moving means 271 produces fluid flow 270.

The movable manner in which heat slug 208 is mounted within socket 201 provides the heat slug with a self-planarization feature. The self-planarization feature enhances the heat transfer capability of the heat slug 208 by maximizing the contact surface area between heat slug contact surface 207 and the backside surface 114 of integrated circuit device 102. Additionally, this feature ensures that a good surface contact is achieved between heat slug 208 and the backside of device 102 even when the planarity of the TCP is skewed.

It is known that exposed silicon dice are generally susceptible to cracking at or near the edges of the dice where stress concentration and the possibility of mechanical damage are at their highest. Cracks formed along the edges tend to propagate through the device and may ultimately result in a device failure when subjected to thermal/mechanical stresses. It is therefore desirable to minimize any external contact with the edges of the integrated circuit during the manufacturing and testing of the devices. Accordingly, in one embodiment, heat slug 208 comprises a stepped configuration wherein the contact surface 207 has a reduced surface area. Hence, in accordance with one implementation of the present invention, the contact surface 207 of heat slug 208 is sized to be smaller than the backside surface 114 of integrated circuit device 102. Thus, when the backside surface 114 of integrated circuit device 102 is brought into contact with the contact surface 207 of heat slug 208, the edges of device 102 do not make contact with heat slug 208.

Figure 2B:
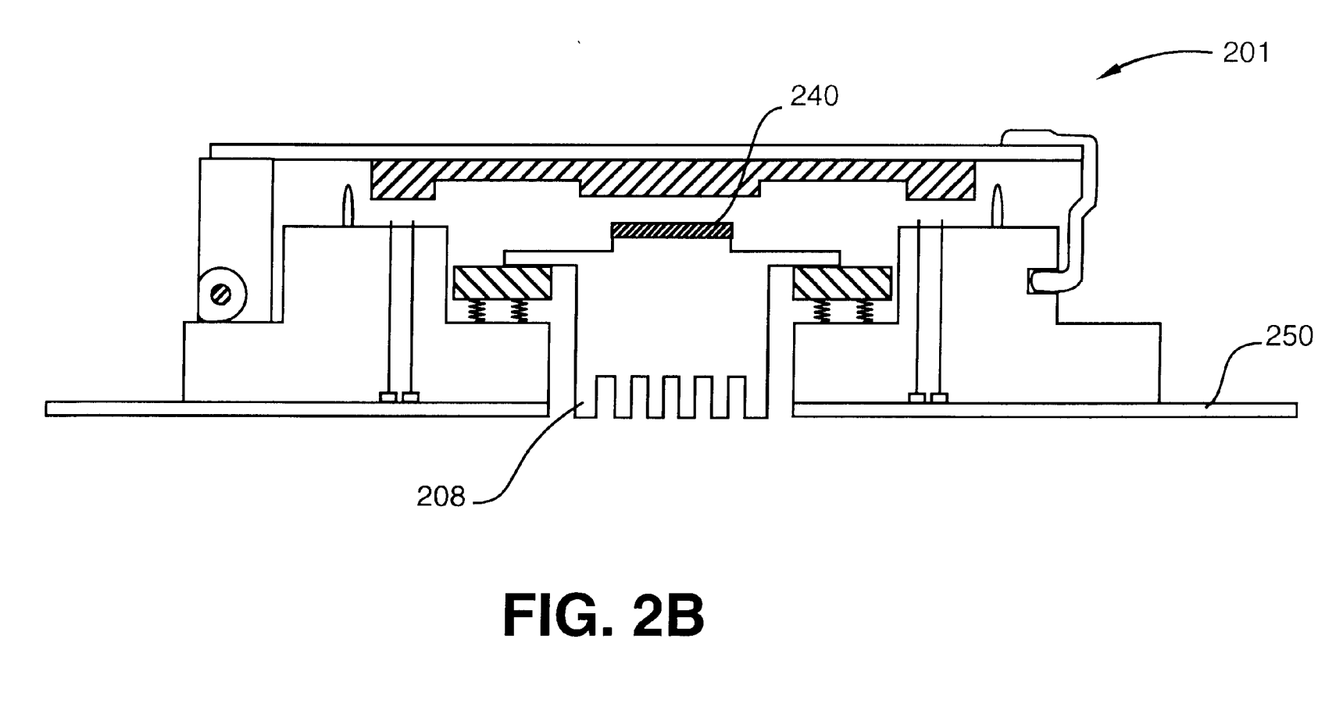
FIG. 2B is a side view of a burn-in socket in another embodiment of the present invention.

In one embodiment, a mechanically compliant and thermally conductive material 240 is provided along the contact surface 207 of heat slug 208 as shown in FIG. 2B. Compliant material 240 helps to maximize the contact surface area between the heat slug 208 and integrated circuit device 102. The compliant material 240 also acts to cushion the backside surface 114 of device 102 from the hard contact surface of heat slug 208, thereby reducing the likelihood that the integrated circuit device 102 will be damaged during the testing of the device.

Figure 3A:
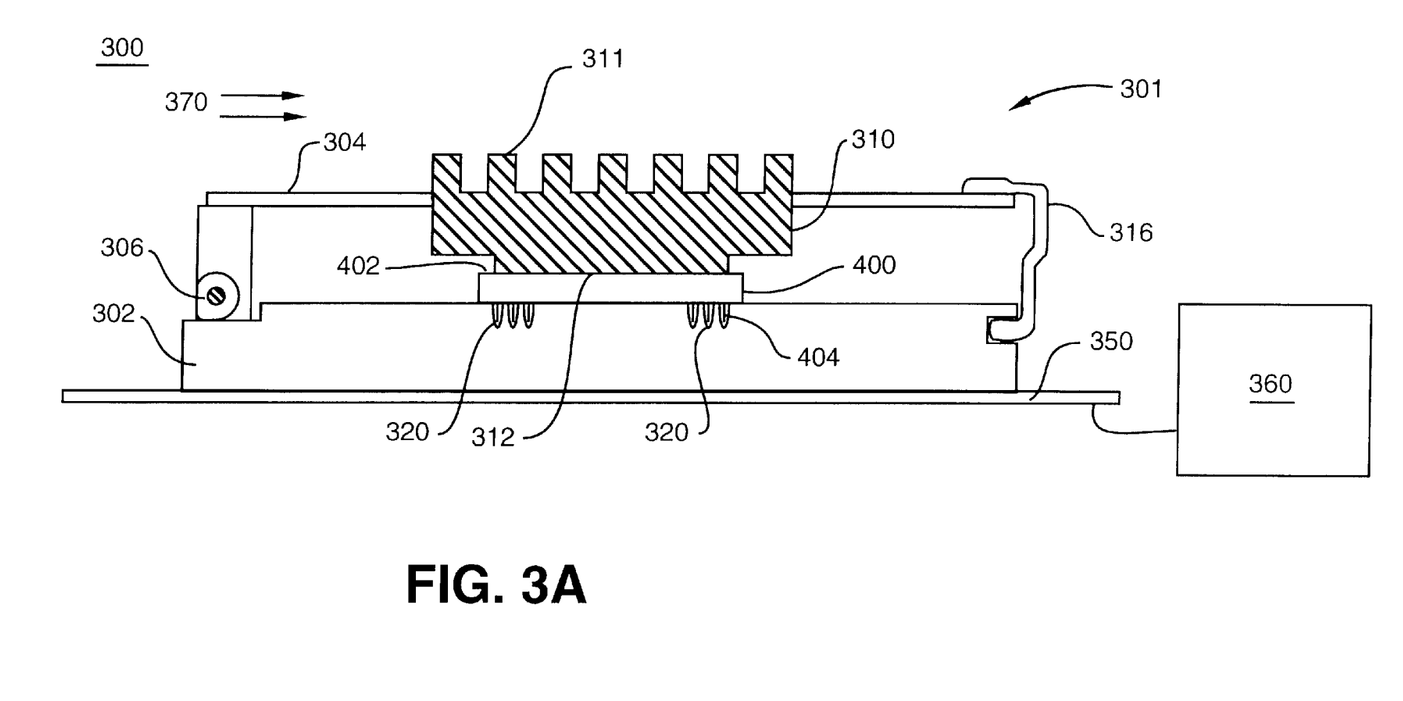
FIG. 3A is a side view of a burn-in socket for testing a pin grid array package in another embodiment of the present invention.

The foregoing discussion has thus been limited to removing heat from an integrated circuit device mounted on a TCP. The present invention, however, is not limited to testing TCPs but may be used in conjunction with other types of packages. For example, FIG. 3A shows a test apparatus 300 for testing an integrated circuit device that is housed within a PGA package 400. The test apparatus 300 includes a socket 301 that is electrically coupled to a burn-in board 350. Burn-in board 350 is, in turn, electrically coupled to a test unit 360 that is used to generate a series of test signals to test the performance of an integrated circuit device housed in package 400. Socket 301 includes a body 302 having a plurality of electrical connectors 320, in the form of electrically conductive apertures, that are arranged to receive the pins 404 of package 400.

A thermally conductive lid 304 is attached to the socket body 302 by a hinge 306. The lid 304 is movable between an open position and a closed position. A releasable latch mechanism 316 is used to hold the lid in a closed position. A heat slug 310 is provided within an opening of lid 304. Heat slug 310 has a contact surface 312 for contacting the backside surface 402 of package 400 when the lid 304 is moved into a closed position as illustrated in FIG. 3A. During testing, excess heat generated within package 400 is conducted away from the package into heat slug 310. The heat is ultimately dissipated through the lid 304 and into a fluid stream 370 that is directed across the surface of the lid. Fins 311 are provided along the top surface of heat slug 310 to increase the heat transfer capability of the heat slug.

Figure 3B:
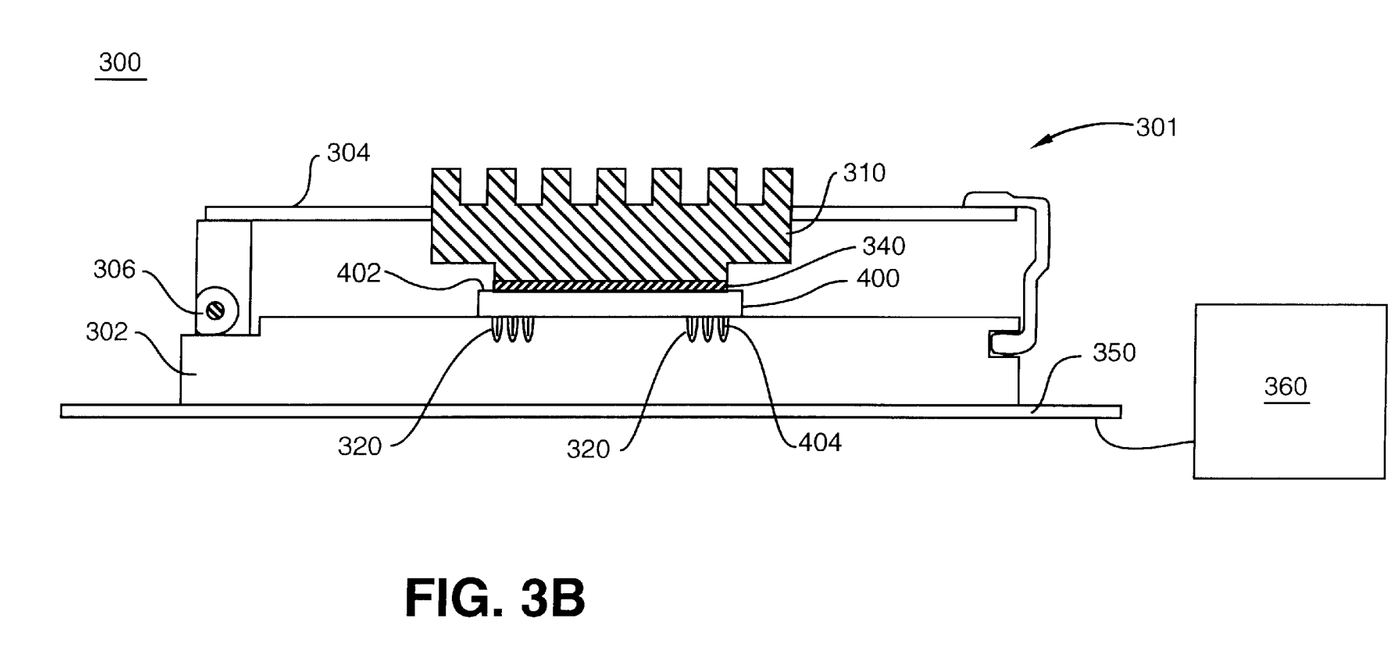
FIG. 3B is a side view of a burn-in socket for testing a pin grid array package in yet another embodiment of the present invention.

In one embodiment, a compliant and thermally conductive material 340 is provided along the contact surface 312 of heat slug 310 as shown in FIG. 3B. Compliant material 340 helps to maximize the contact surface area between the heat slug 310 and package 400. The compliant material 340 also acts to cushion the backside surface 402 of package 400 from the hard contact surface of heat slug 310, thereby reducing the likelihood that the package 400 will be damaged when the heat slug 310 is brought into contact with the backside surface of the package.

A burn-in socket having an integral heat slug been described. Although the present invention has been described with reference to specific exemplary embodiments, it will be evident that various modifications and changes may be made to these embodiments without departing from the broader spirit and scope of the invention. It is also important to note that the present invention is not limited to the testing of integrated circuits housed within a TCP or a PGA package. It is contemplated that the test socket of the present invention may be used to test integrated circuit devices housed within other types of packages. Moreover, it is appreciated that the present invention may be used to remove heat from other electronic or electrical devices. Accordingly, the specifications and drawings are to be regarded in an illustrative rather than a restrictive sense.

What is claimed:

1. A test socket comprising:
    a body having a plurality of electrical connectors disposed along a first surface thereof;
    a first heat slug located within an opening of said body, said first heat slug having a contact surface that is substantially parallel to said first surface; and
    spring means for supporting said first heat slug such that said heat slug is movable in said opening.

2. The test socket of claim 1 further comprising a lid that is hingedly attached to said body, said lid containing a second heat slug.

3. The test socket of claim 1 wherein said first heat slug has fins protruding from a second surface.

4. The test socket of claim 1 wherein said electrical connectors comprise pogo pins.

5. An apparatus for testing an integrated circuit device comprising:
    a body having a plurality of electrical connectors disposed on a top surface thereof for providing test signals to said integrated circuit device and a through opening extending between said top surface and a bottom surface of said body; and
    a first heat slug movably supported within said through opening, said first heat slug having a contact surface for contacting a first surface of said integrated circuit device.

6. The apparatus of claim 5 further comprising a lid that is hingedly attached to said body, said lid being movable between an open position and a closed position, said lid containing at least one formation for forcibly engaging contact pads on said integrated circuit device into intimate contact with said electrical connectors when said lid is in a closed position.

7. The apparatus of claim 6 herein said lid includes a second heat slug for contacting a second surface of said integrated circuit device.

8. The apparatus of claim 5 wherein said contact surface of said first heat slug is sized smaller than said surface of said integrated circuit device.

9. The apparatus of claim 5 wherein said contact surface of said first heat slug comprises a thermally conductive compliant material.

10. The apparatus of claim 5 wherein said first heat slug includes fins.

11. The test apparatus of claim 5 further comprising fluid moving means for producing a fluid flow across a surface of said first heat slug.

12. The test apparatus of claim 10 further comprising fluid moving means for producing a fluid flow across said fins.

13. An apparatus for testing a semiconductor package comprising:
    a tester;
    a socket body having a plurality of electrical connectors disposed on a top surface thereof for contacting electrical contact pads on said semiconductor package and a through opening extending between said top surface and a bottom surface of said body;
    a first heat slug movably supported within said through opening, said first heat slug having a contact surface for contacting a first surface of an integrated circuit device on said semiconductor package, said contact surface being substantially parallel to said top surface of said socket body;
    a lid hingedly attached to said socket body, said lid having formations for pressing said semiconductor package electrical contact pads into intimate contact with said electrical connectors; and
    a printed circuit board electrically coupling said electrical connectors of said socket body to said tester.

14. The apparatus of claim 13 wherein said lid includes a second heat slug for contacting a second surface of said integrated circuit device.

15. The apparatus of claim 13 wherein said first heat slug includes fins.

16. The apparatus of claim 13 further comprising fluid moving means for producing a fluid flow across said first heat slug.

17. The apparatus of claim 15 further comprising fluid moving means for producing a fluid flow across said fins.

18. The apparatus of claim 13 wherein said contact surface of said first heat slug is sized smaller than said first surface of said integrated circuit device.

19. The apparatus of claim 13 wherein said contact surface of said heat slug comprises a thermally conductive compliant material.

20. A test socket comprising:

a body having a plurality of electrically conductive apertures defined within a first surface thereof;

a lid that is hingedly attached to said body; and a heat slug attached to said lid, said heat slug having a contact surface that is substantially parallel to said first surface.

21. The test socket of claim 20 wherein said heat slug has fins, said fins protruding through an opening in said lid.

22. A test socket comprising:

a body having a top surface and a bottom surface;

a plurality of electrically conductive pins each having a first end and a second end, said first end extending through said top surface and said second end extending through said bottom surface for direct connection to a printed circuit board;

a lid that is hingedly attached to said body; and a heat slug attached to said lid, said heat slug having a contact surface that is substantially parallel to said top surface.

23. The test socket of claim 22 wherein said heat slug has fins, said fins protruding through an opening in said lid.

24. The test socket of claim 1 wherein said spring means comprises at least one spring.

25. The test socket of claim 1 wherein said first heat slug includes a flange section supported by said spring means.

26. The test socket of claim 25 further comprising a floating base attached to said flange section, wherein said floating base is supported by said spring means on a ledge located within said opening of said body.

27. A test socket comprising:

a body having a plurality of electrical connectors disposed along a first surface thereof;

a first heat slug located within an opening of said body, said first heat slug having a contact surface that is substantially parallel to said first surface; and a spring supporting said first heat slug such that said heat slug is movable in said opening.

28. The test socket of claim 27 further comprising a lid that is hingedly attached to said body, said lid containing a second heat slug.

29. The test socket of claim 27 wherein said first heat slug has fins protruding from a second surface on said body.

30. The test socket of claim 27 wherein said electrical connectors comprise pogo pins.

31. The test socket of claim 27 wherein said first heat slug includes a flange section supported by said spring.

32. The test socket of claim 31 further comprising a floating base attached to said flange section, wherein said floating base is supported by said spring on a ledge located within said opening of said body.

* * * * *

UNITED STATES PATENT AND TRADEMARK OFFICE
CERTIFICATE OF CORRECTION

PATENT NO. : 6,072,322
DATED : June 6, 2000
INVENTOR(S) : Viswanath et al.

Page 1 of 1

It is certified that error appears in the above-identified patent and that said Letters Patent is hereby corrected as shown below:

Item [75], Navid Shahriari should be listed as an additional inventor.

Signed and Sealed this

Eighteenth Day of September, 2001

*Attest:*

Nicholas P. Godici

*Attesting Officer*

NICHOLAS P. GODICI
*Acting Director of the United States Patent and Trademark Office*